United States Patent [19]

Valaas

[11] Patent Number: 4,788,490
[45] Date of Patent: Nov. 29, 1988

[54] METHOD OF MEASURING RESISTANCE OF A CONTROL SERVOVALVE

[75] Inventor: Andrew M. Valaas, Bellevue, Wash.

[73] Assignee: The Boeing Company, Seattle, Wash.

[21] Appl. No.: 68,690

[22] Filed: Jul. 2, 1987

[51] Int. Cl.$^4$ .............................................. G01R 27/02
[52] U.S. Cl. .................... 324/62; 324/65 R; 374/172
[58] Field of Search .............. 303/20, 17, 103; 374/172, 173, 163; 324/62 R, 64, 65 R, 158 D, 158 T, 430

[56] References Cited

U.S. PATENT DOCUMENTS

| | | | |
|---|---|---|---|
| 3,048,776 | 8/1962 | Logan | 324/158 D |
| 3,387,211 | 6/1968 | Kaufmann | 324/158 D |
| 3,417,323 | 12/1968 | Williamson | 324/421 |
| 3,676,770 | 7/1972 | Sharaf | 324/62 |
| 3,783,382 | 1/1974 | Reynolds | 324/62 |
| 4,484,050 | 11/1984 | Horinuochi | 374/172 |

Primary Examiner—Reinhard J. Eisenzopf
Assistant Examiner—Jose M. Solis
Attorney, Agent, or Firm—Conrad O. Gardner; B. A. Donahue

[57] ABSTRACT

A method for measuring resistance of an electromagnetic servovalve associated with a brake torque limiting control system. The servovalve is controlled by two parallel connected controllers, one a current driver controller and the other a voltage driver controller whose output is dependent upon the resistance value being measured. The method includes a short series of sequential steps and computation executed by the voltage driver controller.

1 Claim, 1 Drawing Sheet

1

METHOD OF MEASURING RESISTANCE OF A CONTROL SERVOVALVE

BACKGROUND OF THE INVENTION

The present invention relates to control systems for current-sensitive control devices, and more particularly, to more accurate control of current-sensitive control devices through resistance measurement techniques.

Prior attempts to control a common device with the greater of the outputs from two controllers have required that the control device be fitted with dual control coils as described in U.S. Pat. No. 4,043,607 to Signorelli et al. or that additional hardware be added as described in U.S. Pat. No. 4,412,291 to Amberg et al. to select the greater of the two output signals to be applied to the control device. Diode selection circuits have been utilized heretofore as exemplified by U.S. Pat. No. 3,461,315.

It is accordingly an object of the present invention to provide accurate control of a current-sensitive device e.g. a servovalve which is controlled by two parallel connected controllers, one being a current driver controller and the other a voltage driver controller. Control voltages from the voltage controller are applied subsequent to resistance measurement of the servovalve coil.

In accordance with a preferred embodiment of the present invention, the method of resistance measurement on the servovalve coil is accomplished through a series of sequential steps and computations utilizing the voltage driver controller.

Further objects and advantages of the invention will become apparent from the following description, which is given by way of example, with reference to the accompanying drawing, in which:

DESCRIPTION OF THE PREFERRED EMBODIMENTS

Figure 1:
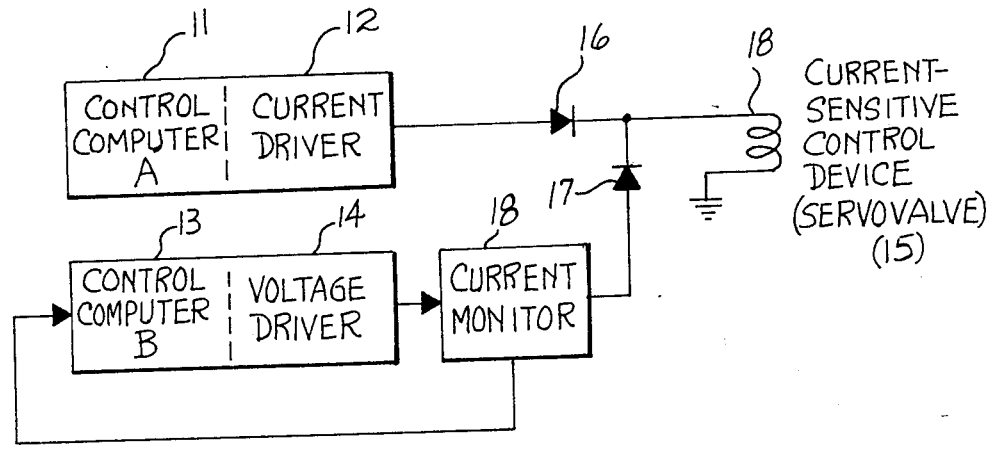
FIG. 1 is a block diagram and circuit schematic showing a preferred embodiment of the present joint control of a single current-sensitive device utilizing two controllers; and, FIG. 2 is a graphical representation of the present resistance measuring method utilized in the system of FIG. 1.

The system of FIG. 1 comprises a brake torque limiting system for use on aircraft wherein a common output control device 15 viz. a hydraulic pressure reduction servovalve is shared by two controllers 11 and 13. The servovalve is a current-sensitive device in that the pressure reduction in the brake torque limiting system is a function of the current applied to the valve coil 18. Controller A shown at 11 comprises an antiskid system control unit having a current driver output 12. Controller B shown at 13 is a brake torque limiter control system with voltage driver output 14. Connection of controllers 11 and 13 in series through diodes 16 and 17 respectively allows the greater of the outputs from the two controllers to be applied to valve coil 18 of the servovalve. Controller B shown at 13 utilizes a voltage driver output 14 since use of a current driver output would result in the sum, not the greater, of the output commands from controllers 11 and 13 being applied to valve coil 18 of the servovalve. Parallel operation is provided by controllers 11 and 13.

Accurate control of the servovalve by controller 13 however, requires that controller 13 maintain precise current control, not voltage control, of the servovalve. This can be accomplished if the resistance of servovalve coil 18 is known to controller 13 so that the voltage required to provide the desired control current may be computed. The servovalve 15 is located in the unpressurized area of an airplane and is exposed to wide extremes of ambient temperature. Since servovalve coil 18 will experience a considerable variation in resistance as the coil temperature changes, accurate control of the valve current can be achieved only if controller 13 is provided with a means to measure the valve coil 18 resistance just prior to application of a control voltage.

The problem of measuring servovalve coil 18 resistance is further complicated by the fact that controller 11 imposes a bias current on servovalve coil 18 for fault monitoring purposes. Accordingly a method is required to provide a means for measuring servovalve coil 18 resistance. The system of FIG. 1 is thus seen to provide antiskid control and torque limiting control where the torque limiting control 13 utilizes an output voltage driver circuit 14. The present system solves the specific problem of providing a controller, viz. a torque limiting controller and associated voltage driver and current monitor for measuring the servovalve coil 18 resistance while it is simultaneously energized by a second independent controller 11 which is providing antiskid control. Diodes 16 and 17 which were hereinbefore mentioned are series connected between controller 11 and controller 13 respectively to servovalve coil 18 to prevent the flow of current from one controller into the other controller.

It is the object of the present system to measure the resistance of the current-sensitive control device input comprising servovalve coil 18 so that controller 13 may compute the voltage necessary to impose a desired control current in current-sensitive control device 15. To achieve this purpose, current monitor 18 is coupled downstream of voltage driver 14 to measure the current output of voltage driver 14. Current monitor 18 measures the differential voltage across, for example, an accurately known resistance in series with the output line. The differential voltage is proportional to current and, since the resistance is known, the current value is known.

Figure 2:
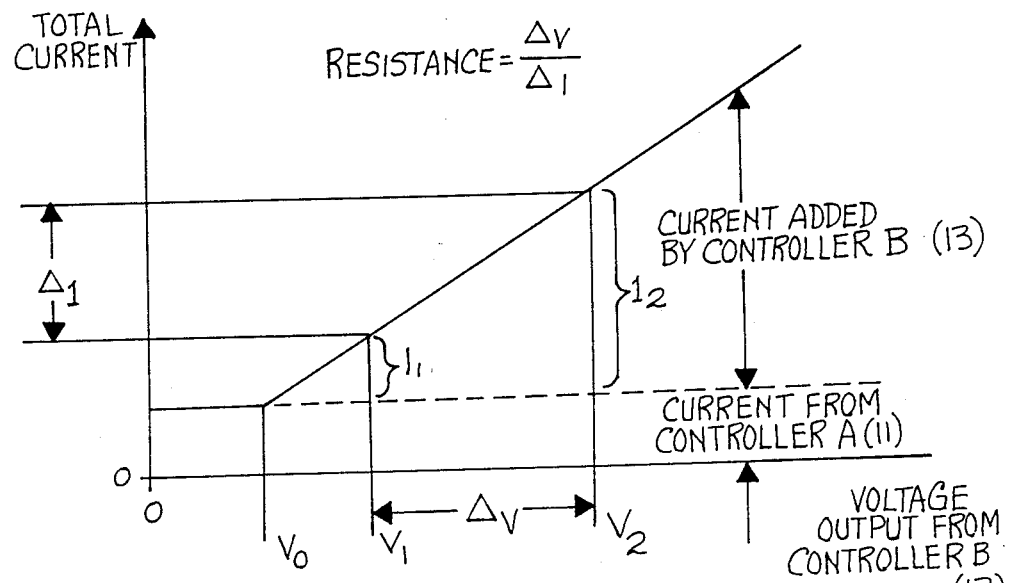

The method of measuring the resistance of the current-sensitive control device 15 which comprises servovalve coil 18 is shown in FIG. 2. The method comprises a series of sequential applications of voltages increased step-by-step with resistance computation provided by controller 13. In the first step, controller 13 applies a moderate voltage command $V_1$ to servovalve coil 18. This voltage level must exceed the voltage $V_0$ which is the aforementioned bias current from controller 11. At the same time as the voltage $V_1$ is applied, the current $I_1$ provided by controller 13 is measured and retained in memory at controller B. In the next step controller 13 applies a higher voltage command $V_2$ to servovalve coil 18. The resulting current $I_2$ provided by controller 13 is again measured and retained in memory. The final step is a computation of the resistance based on the differential form of Ohms law, which is:

$$R = (V_2 - V_1)/(I_2 - I_1)$$

where R is the servovalve coil 18 resistance.

It can be seen that the present system utilizes a method of providing electrical current control of a device which is responsive to electrical current by using an electrical voltage driver output in a controller in conjunction with a method of measuring the resistance of the control device just prior to application of the control output and by using the resistance data to compute the electrical voltage output required to achieve the desired electrical current output. The method of measuring the resistance of the control device consists of the sequential steps of applying an electrical control voltage output $V_1$, measuring the results of electrical current output $I_1$, applying a second electrical control voltage output $V_2$, measuring the resultant electrical current output $I_2$, and then determining the resistance R, from the differential form of Ohms law:

$$R = (V_2 - V_1)/(I_2 - I_1).$$

The present system enables the measurement of resistance in a control device which has a fixed current applied to it from a second independent source. The two controller sources are connected by diodes such that neither controller can receive current from the other controller and the aforementioned voltages $V_1$ and $V_2$ are greater than the voltage resulting from the current applied by the second controller.

What is claimed is:

1. In combination in a system comprising:
    a first control circuit having a current driver output;
    a second control circuit having a voltage driver output;
    said first and second control circuits connected in parallel through series connected diodes to a current-sensitive control device; the method of determining the electrical resistance R of said current-sensitive control device comprising the sequential steps of:
    applying an electrical control voltage $V_1$;
    measuring the resultant electrical current output $I_1$;
    applying a second electrical control voltage $V_2$;
    measuring the second electrical current output $I_2$, and then determining the resistance R in accordance with the differential form of Ohms law:

$$R = (V_2 - V_1)/(I_2 - I_1);$$

wherein said first control circuit comprises an aircraft antiskid control system and said second control circuit comprises a brake torque limiter control circuit.

* * * * *